United States Patent [19]

Novosel et al.

[11] Patent Number: 5,839,093
[45] Date of Patent: Nov. 17, 1998

[54] SYSTEM FOR LOCATING FAULTS AND ESTIMATING FAULT RESISTANCE IN DISTRIBUTION NETWORKS WITH TAPPED LOADS

[75] Inventors: Damir Novosel, Cary; David Hart, Raleigh; Yi Hu, Cary, all of N.C.; Jorma Myllymaki, Tampere, Finland

[73] Assignee: ABB Transmit Oy, Vaasa, Finland

[21] Appl. No.: 777,623

[22] Filed: Dec. 31, 1996

[51] Int. Cl.⁶ ................................................. H02H 3/26
[52] U.S. Cl. .................. 702/59; 702/58; 364/528.27; 364/528.28; 364/528.29; 361/65; 361/63; 361/79; 361/80; 324/525
[58] Field of Search ........................... 364/492, 480–483, 364/550, 551.01, 555, 579, 580, 802, 528.27–528.29, 807, 823, 838; 324/512, 522, 521, 525, 531, 543, 727, 533; 361/80, 88, 63, 68, 79, 86, 93, 65, 76, 77, 82, 84, 85; 702/57–60, 64, 65, 72

[56] References Cited

U.S. PATENT DOCUMENTS

| | | | |
|---|---|---|---|
| 3,590,368 | 6/1971 | Esclangon | 324/543 |
| 4,107,778 | 8/1978 | Nii et al. | 364/492 |
| 4,128,805 | 12/1978 | Lanz | 324/727 |
| 4,159,462 | 6/1979 | Rocha et al. | 367/97 |
| 4,313,169 | 1/1982 | Takagi et al. | 364/492 |
| 4,313,199 | 1/1982 | Aichelmann, Jr. et al. | 371/21.2 |
| 4,499,417 | 2/1985 | Wright et al. | 324/533 |
| 4,559,491 | 12/1985 | Saha | 324/522 |
| 4,841,405 | 6/1989 | Udren | 361/80 |
| 4,857,854 | 8/1989 | Matsushima | 324/512 |
| 4,906,937 | 3/1990 | Wikström et al. | 324/523 |
| 4,996,624 | 2/1991 | Schweitzer et al. | 361/63 |
| 5,072,403 | 12/1991 | Johns | 364/492 |
| 5,428,549 | 6/1995 | Chen | 364/483 |
| 5,455,776 | 10/1995 | Novosel | 364/483 |
| 5,661,664 | 8/1997 | Novosel et al. | 364/492 |

Primary Examiner—Emanuel Todd Voeltz
Assistant Examiner—Hal D. Wachsman

[57] ABSTRACT

Both fault location and fault resistance of a fault are calculated by the present method and system. The method and system takes into account the effects of fault resistance and load flow, thereby calculating fault resistance by taking into consideration the current flowing through the distribution network as well as the effect of fault impedance. A direct method calculates fault location and fault resistance directly while an iterative fashion method utilizes simpler calculations in an iterative fashion which first assumes that the phase angle of the current distribution factor $D_s$ is zero, calculates an estimate of fault location utilizing this assumption, and then iteratively calculates a new value of the phase angle $\beta_s$ of the current distribution factor $D_s$ and fault location m until a sufficiently accurate determination of fault location is ascertained. Fault resistance is then calculated based upon the calculated fault location. The techniques are equally applicable to a three-phase system once fault type is identified.

31 Claims, 7 Drawing Sheets

SYSTEM FOR LOCATING FAULTS AND ESTIMATING FAULT RESISTANCE IN DISTRIBUTION NETWORKS WITH TAPPED LOADS

The present application is directed to a system and method for locating faults and estimating fault resistance in a distribution network, particularly a power distribution network wherein the power feed lines have tapped loads.

BACKGROUND OF THE INVENTION

Accurate fault location is important to power utility distribution networks in order to insure reliable economic operation of the system. Despite the reliability of the power network componentry utilized in today's power distribution network, faults may nevertheless occur. Reliability in such a power distribution network depends on rapid location and isolation of any fault occurring within the distribution network. In order to quickly isolate and repair such a fault, the fault must be accurately located. Accurate fault location reduces the number of switching operations required to isolate a faulted line section after a permanent fault. This results in quick restoration of power supply to those customers not serviced by the faulted line section, and further facilitates quick repair of the faulted line section, also speeding up the restoration of power to those customers serviced by the faulted line section.

It is also beneficial to develop an accurate estimation of the resistance of the fault. The fault resistance value is useful for post fault analysis of the fault and of network grounding. In the system of the present application, consideration of the fault resistance also facilitates more accurate estimation of fault position.

In such a distribution network, when a fault occurs, existing relaying schemes typically make correct and fast tripping decisions based upon relatively simple measurements computed in real time. Such relaying schemes automatically isolate a faulted line section so that power distribution remains on unfaulted portions of the distribution network.

The faulted line section must be then located and repaired. Since line repair must be manually performed by the distribution system's maintenance personnel, accurate identification of physical fault location is not required instantaneously, even several minutes after the fault has occurred being acceptable. This allows for elaborate calculations which may be more complicated than those employed in tripping the relays to isolate the faulted line section. Because of this, fault location techniques are normally employed after the fault has occurred using stored fault data. The monitored data includes voltage and current waveform values at the line terminals before, during, and after the fault. These values are either stored as waveform samples, or computed phasors, by microprocessor based line relays, Digital Fault Recorders "DFRs" or dedicated fault-locating systems, all installed at the power substation. The use of this data to identify fault location may be performed at the substation within the line relay or DFR, which may display the results, or may be transmitted to a remote site using low speed data communications or Supervising Control and Data Acquisition (SCADA) systems as is known in the art.

Accurate transmission line fault location methods and devices have been developed and applied successfully in the field for many years. However, transmission line fault location is considerably less complex due to the absence of tapped loads and tapped laterals. The distribution feeders of distribution networks are normally arranged in a radial configuration with a number of tapped loads and laterals. The tapped laterals may also have several tapped loads. Typically, voltage and current of a feeder are only measured at the sub-station from which the feeder originates, while the voltage and current of tapped loads and laterals are not measured. Thus, location of faults in distribution networks is substantially more complex than fault location on transmission lines which do not have the increased complexity of tapped laterals having tapped loads.

Figure 1:
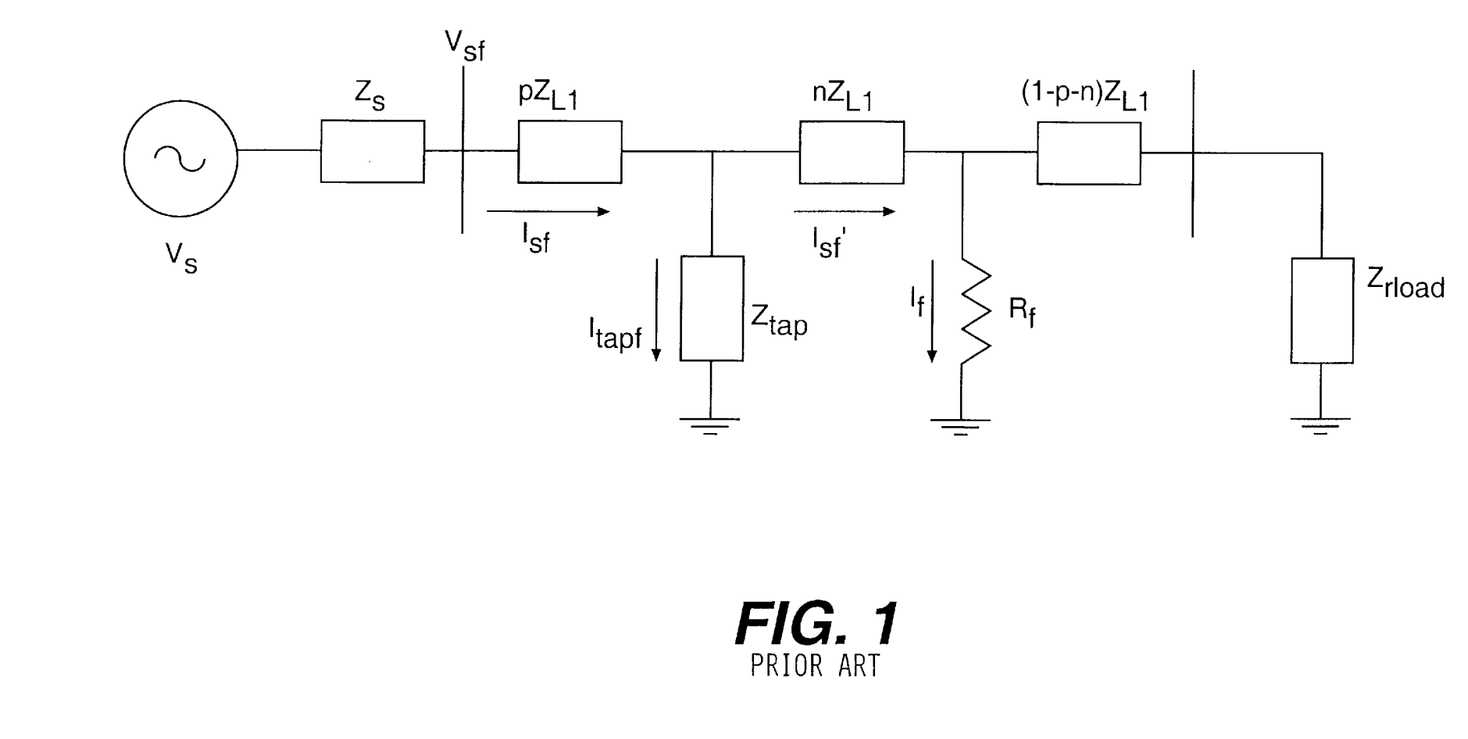
FIG. 1 is a schematic diagram of a faulted distribution network having a single tapped load $Z_{tap}$.

The problem with distribution networks may be more readily understood by an examination of the exemplary circuit of FIG. 1 of the present application. In FIG. 1:

$V_s$ is the source voltage;

$Z_s$ is the source impedance;

$Z_{L1}$ is the positive sequence line impedance;

$R_f$ is the fault impedance;

$V_{sf}$ is the voltage applied by the source to the line section after the fault;

$I_{sf}$ is the source current after the fault;

$Z_{tap}$ is the lumped impedance of the tap;

$I_{tapf}$ is the current through the tap after the fault;

$I_{sf}'$ is the current through the line after the tap and is equal to $I_{sf} - I_{tapf}$;

p is the per unit distance between the source and the tap;

n is the per unit distance between the tap and the fault; and m is the per unit distance between the source and the fault and is equal to p+n.

In FIG. 1, loads behind the fault are lumped into the impedance $Z_{rload}$. This is possible since the load impedance is much larger than the line impedance. In practice $Z_{rload} \gg (1-p-n)Z_{L1}$. All tapped loads between the source and the fault are replaced by the lumped impedance $Z_{tap}$.

It is apparent that FIG. 1 can be accurately described by the following equation:

$$V_{sf} = pZ_{L1}I_{sf} + nZ_{L1}I'_{sf} + R_f I_f \quad (1)$$

It is also apparent that the measured apparent impedance $Z_{meas}$ is:

$$Z_{meas} = \left(\frac{V_{sf}}{I_{sf}}\right) = pZ_{L1} + nZ_{L1}\left(\frac{I'_{sf}}{I_{sf}}\right) + R_f\left(\frac{I_f}{I_{sf}}\right). \quad (2)$$

or:

$$Z_{meas} = \left(\frac{V_{sf}}{I_{sf}}\right) = Z_{L1}\left(p + n\left(\frac{I'_{sf}}{I_{sf}}\right)\right) + R_f\left(\frac{I_f}{I_{sf}}\right) \quad (3)$$

Since $I_{sf}' = I_{sf} - I_{tapf}$, Equation 3 becomes:

$$Z_{meas} = \left(\frac{V_{sf}}{I_{sf}}\right) = Z_{L1}\left(p + n\left(1 - \frac{I_{tapf}}{I_{sf}}\right)\right) + R_f\left(\frac{I_f}{I_{sf}}\right) \quad (4)$$

A problem with known systems of fault location is that fault current $I_f$, post-fault tap current $I_{tapf}$, and fault resistance $R_f$ are not generally taken into account and accordingly the current methods can create substantial errors as a result thereof. It is apparent from equation 4 that distribution networks with tapped loads create a substantial difficulty in estimating fault resistance and location in the distribution network.

Perhaps the most common type of fault location technique in distribution networks is the so called "reactance method" which will be described with reference to FIGS. 2(a) and 2(b) of the present application.

Figure 2A:
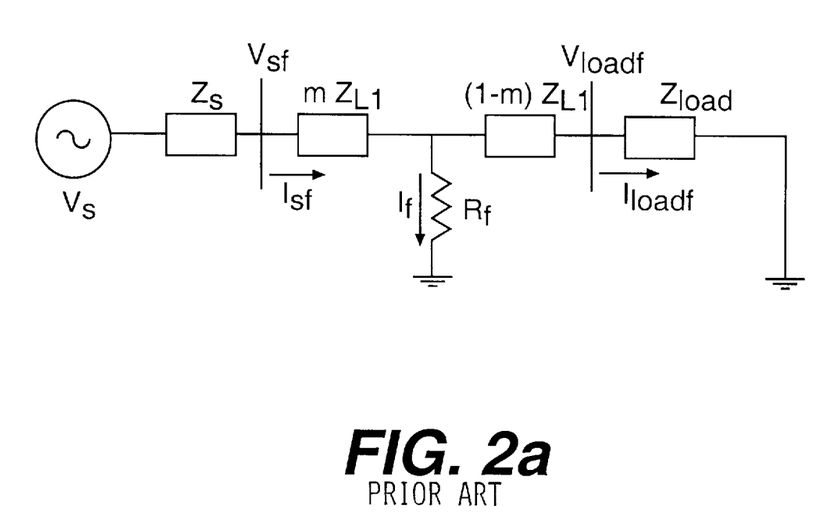
FIG. 2(a) is a schematic diagram of a faulted distribution network section in which the tapped load $Z_{tap}$ is lumped with the load impedance $Z_{load}$.

To describe the effect of load current and fault resistance, the model of the distribution network shown in FIG. 2(a) is used. In FIG. 2(a):

$V_s$ is the source voltage;

$Z_s$ is the source impedance;

$Z_{L1}$ is the positive sequence line impedance which may be measured pre-fault;

$R_f$ is the fault impedance;

$Z_{load}$ is the load impedance;

$V_{sf}$ is the voltage applied by the source to the line section after the fault;

$V_{loadf}$ is the voltage across the load after the fault; and m is the distance along the faulted line section of impedance $Z_{L1}$ as a percentage of total line section length.

For this model, all loads are lumped into one load impedance $Z_{load}$.

Figure 2B:
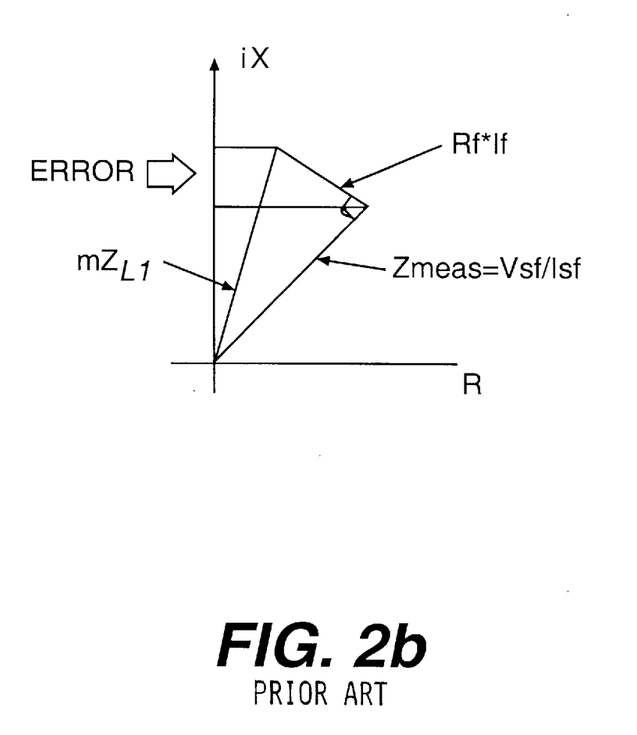
FIG. 2(b) is a phasor diagram graphically illustrating the error in the prior art reactance method.

The effect of load current and fault resistance is illustrated in FIG. 2(b) which is a phasor diagram illustrating the presence of error in the reactance algorithm where the abscissa represents real impedance and the ordinate represents imaginary impedance.

The reactance method compares the computed apparent line reactance with the total line reactance to determine the fault location relative to the line length. Under the reactance method, $$m = \frac{Im\left(\frac{V_{sf}}{I_{sf}}\right)}{Im(Z_{L1})} \quad (5)$$

For this equation, $V_{sf}$ equals the phase-to-ground voltage for phase-to-ground faults, and equals the phase-to-phase voltage for phase-to-phase faults. $I_{sf}$ equals the compensated phase current for a phase-to-ground fault and equals phase current difference for a phase-to-phase fault.

While this method produces a reasonable estimate of fault location on transmission lines, if one attempts to apply it to a distribution network, the accuracy is affected by a number of factors, including the failure of this algorithm to take into account the effect of fault impedance and load current. In the reactance method, as illustrated in FIG. 2(b) the calculated imaginary part of the apparent impedance $Z_{meas}$ which is equal to $V_{sf}/I_{sf}$ will be different than the imaginary part of the impedance to the fault $mZ_{L1}$. This is because equation (5) does not take into account fault resistance $R_f$. The impedance measured at the sub-station, for the fault through resistance $R_f$, is:

$$Z_{meas} = \frac{V_{sf}}{I_{sf}} = \frac{mZ_{L1}*I_{sf} + R_f*I_f}{I_{sf}} = \quad (6)$$

$$mZ_{L1} + R_f*\left(\frac{I_f}{I_{sf}}\right) = mZ_{L1} + R_f*k_s$$

where $k_s$ is the ratio of the fault current $I_f$ to the relay location post fault current $I_{sf}$.

If the ratio $k_s$ is a complex number, the fault resistance appears as an impedance with the reactive component depending upon the argument of $k_s$. For a distribution network, the reactive component will be capacitive as shown in FIG. 2(b) unless large motors start feeding the fault to produce large inductive values. The angle of $k_s$ will be zero if the current $I_{sf}$ and the fault current $I_f$ are in phase. This will be the case only if the load current $I_{loadf}$ is either zero or in-phase with the sub-station current $I_{sf}$. Since $I_{loadf}$ and $I_{sf}$ typically differ in phase in a distribution network, load current needs to be considered to achieve an accurate estimate of fault location. For this reason, the reactance method explained herein below can create substantial errors in fault location estimation.

It has long been desirable to detect fault location within the distribution network when the fault occurs. Some known methods determine fault location by detecting values at two points in the distribution network, where the fault occurs between these two points. Such methods have the disadvantage that measurements must be made in two remote locations and assembled in a single location. Further, such methods cannot be performed solely within the power substation thereby rendering the logistics of assembling data more difficult and less reliable.

Traveling wave fault locators are also known and used. However, such fault locators require signal generation hardware which must operate at a relatively high sampling rate, thereby increasing complexity and expense.

Various fault location methods have attempted to improve upon the reactance method by making certain assumptions concerning, the source impedances, fault resistance, loading and other factors. However, these methods of locating distribution network faults have not produced fault resistance dependent answers which take into account the actual fault resistance and, because of their assumptions, which also fail to take into account load current variation, were particularly susceptible to errors caused by tapped loads. Thus, such methods suffer disadvantages when locating faults in distribution networks with tapped loads.

Many existing systems assume fault resistance is nearly zero. However, the value of fault resistance may be particularly high for ground faults, which represent the majority of faults on overhead lines. Accordingly, simplistic calculations may be substantially adversely affected by the combined effects of load current and fault resistance.

Many of the prior art techniques assume that distribution networks are well balanced. Tapped loads and laterals are often single or two phased loads. This can create a system configuration imbalance which causes load unbalance which can be as high as 25% or more between phases in normal operation. In such circumstances, systems which assume a balanced distribution network can not accurately locate faults.

Additional problems can exist in inaccurate fault type identification, the identification of incorrect faulted phases. Further, uncertainty about line parameters, particularly zero sequence impedance may exist.

Previous work related to distribution networks assume that all transformers on the tapped lines were Δ-Y (delta-wye) and that the load current beyond the fault location was negligible. See, for example, U.S. Pat. No. 4,996,624 to Schweitzer, III, entitled Fault Location Method for Radial Transmission and Distribution Systems, issued Feb. 26, 1991. Since there is no ground return through Δ-Y transformers, the zero sequence current is used to avoid influence of the tapped load on the fault location estimation for the single line-to-ground faults. However, if the primary of the distribution transformer is not connected in delta or the fault current beyond the fault location is non-negligible, this method produces inaccuracies. Further, the method of the Schweitzer patent is limited to single line-to-ground faults. Other fault types cannot be located with the Schweitzer system.

From the foregoing, it is apparent that an improved system for locating faults and estimating fault resistance in distribution networks would be advantageous.

SUMMARY OF THE INVENTION

Accordingly, it is an object of the present invention to produce an improved method and system for locating faults more accurately and estimating fault resistance in distribution networks with tapped loads.

It is another object of the present invention to more accurately identify fault locations in distribution networks by taking into account the effect of load current in the fault location calculations.

It is still another object of the present invention to utilize only local voltage and current data at the sub-station in order to locate a fault and estimate fault resistance.

It is a further object of the present invention to perform the above mentioned method with a system which is not affected by load current, fault resistance, load flow unbalance, or any other characteristic of the sub-transmission network.

It is a further object of the present invention to perform the above mentioned objects regardless of the transformer connections on the tapped lines.

It is a still further object of the present invention to locate faults and estimate fault resistance for any fault type including single line-to-ground, line-to-line, line-to-line-to-ground, as well as 3-phase faults.

These objects are accomplished by virtue of the present invention's method and system for locating faults and estimating fault resistance. The system and method of the present invention achieves the above objects through its method of estimating distribution network fault location and resistance while taking into account load current and fault resistance, aspects of the faulted distribution network that the prior fault location methodology did not take into account.

The present invention solves for the fault distance while taking into consideration both fault resistance and the flow of current through the load of the distribution network. Accordingly, the equations solved in accordance with the method of the present invention takes into consideration the distribution factor, the change in source current due to fault current as well as the fault resistance. The system and method of the present invention employs two techniques for determining fault location. A first iterative technique utilizes simpler calculations but must iteratively perform them, while a direct calculation technique utilizes a more complex quadratic equation but solves for fault distance directly.

According to the teachings of the present application, the system of the present application monitors pre and post-fault current and voltage values at a monitor or source location and utilizes these values along with the unit impedance of the distribution network to determine fault location. The load and source impedance are first calculated. Then, equations which have been identified and which consider both the effect of fault resistance and fault induced change in load current calculate fault location based on known circuit parameters. This may be done in two fashions.

In the direct calculation technique, a complex quadratic equation of m, the distance to the fault as a proportion of distribution network length is calculated, where m is the quadratic variable. While the calculations are more complex than in the iterative embodiment, the calculations may be directly performed in this embodiment. In the iterative embodiment, $\beta_s$, the phase angle change in source current induced by the fault is related to the distance to the fault in a known fashion. $\beta_s$ is first assumed to be zero. Based on this assumption, the unit complex number $\Phi$ related to fault induced change in phase angle is calculated. Based upon this calculation of $\Phi$, the fault location m is calculated. $\beta_s$ is then derived from m. $\Phi$ and m are then iteratively calculated. Through continued iteration, error in m converges to where m can be accurately ascertained.

Accordingly, it is apparent that the present invention involves a method for locating faults and estimating fault resistance in a distribution network having tapped loads, the method comprising obtaining known circuit parameters including measuring pre and post fault current and voltage values at a monitoring location, calculating the load and source impedance $Z_{load}$ and $Z_s$ from the known circuit parameters obtained in the obtaining step, identifying equations which consider the effect of fault resistance and fault induced change in load current and which relates fault location to known circuit parameters, solving the identified equations to develop a fault location value.

It is further apparent that the present invention that involves a method of locating faults and estimating fault resistance in a distribution network having tapped loads, the method comprising calculating the load and source impedance $Z_{load}$ and $Z_s$ from pre and post fault current and voltage values measured at a monitoring location, estimating the phase angle $\beta_s$ of the current distribution factor $d_s$, calculating an estimate of $\theta$ based on $\beta_s$, calculating an estimate of fault location m based on the value of $\theta$ as calculated, calculating a new value of the phase angle $\beta_s$ of the current distribution factor $d_s$ based on the value of m obtained while considering a variable related to fault resistance, and repeating said steps until m converges to a desired accuracy.

It is also apparent that the present invention is directed to a system for locating faults and estimating fault resistance in a distribution network having tapped loads comprising a voltage sensor for measuring line voltage at a monitoring or source location, a current sensor for measuring line current at a monitoring or source location, said voltage and current sensors developing pre-fault voltage and current measurements $V_{ps}$ and $I_{ps}$, and post-fault voltage and current measurements $V_{sf}$ and $I_{sf}$, means for calculating the load and source impedance $Z_{load}$ and $Z_s$ from the pre-fault voltage and current measurements $V_{ps}$ and $I_{ps}$, and post-fault voltage and current measurements $V_{sf}$ and $I_{sf}$ as well as the per unit distribution network impedance $Z_{L1}$, and means for solving equations which consider the effect of fault resistance and fault induced change in load current and which relates fault location to known circuit parameters to develop a fault location value m.

The present invention is further directed to a system for locating faults and estimating fault resistance in a distribution network having tapped loads comprising a voltage sensor for measuring line voltage at a monitoring or source location, a current sensor for measuring line current at a monitoring or source location, said voltage and current sensors developing pre-fault voltage and current measurements $V_{ps}$ and $I_{ps}$, and post-fault voltage and current measurements $V_{sf}$ and $I_{sf}$, means for calculating the load and source impedance $Z_{load}$ and $Z_s$ from the pre-fault voltage and current measurements $V_{ps}$ and $I_{ps}$, and post-fault voltage and current measurements $V_{sf}$ and $I_{sf}$ as well as the per unit distribution network impedance $Z_{L1}$, means for iteratively solving equations which consider the effect of fault resistance and fault induced change in load current and which relates fault location to known circuit parameters to develop a fault location value m, including first means for calculating $\theta$ based on $\beta_s$, second means for calculating fault location m based on the value of $\theta$, and third means for calculating the phase angle $\beta_s$ of the current distribution factor $d_s$ based on the value of m while considering a variable related to fault resistance, said means for iteratively solving iteratively processing in said first through third means for calculating based on converging estimates of the values of m and $\beta_s$ until a desired accuracy is reached.

The features and advantages of the present invention will be more fully appreciated by an examination of the detailed description presented herein below with reference to the drawing figures.

BRIEF DESCRIPTION OF THE DRAWINGS

The teachings of the present application may more readily be understood with reference to the appended drawings, which are described in the detailed description presented herein below. In these drawings.

DETAILED DESCRIPTION OF THE PREFERRED EMBODIMENTS

The method used in the system for locating faults and estimating fault resistance according to the teachings of the present invention will now be described in detail with reference to the equations presented in the specification and the attached figures. The present invention describes a new approach for locating faults and calculating fault resistance in distribution networks. This approach is applicable for any fault type including single line-to-ground, line-to-line, line-to-line-to-ground and 3-phase faults.

The present invention takes into consideration the combined effect of the load current and the fault resistance by utilizing principles which can be implemented in one of two preferred embodiments.

Although based upon the same mathematics, one method utilizes a simpler iterative approach while the second method utilizes more complex calculations but does not require iteration. One important advantage of the methodology utilized in the present invention is that fault location estimates are not affected by the mutual effect of load flow (the flow of current through the load post-fault) and fault resistance and do not require any particular distribution transformer configuration.

The method and system of the present invention calculate the load impedance $Z_{load}$ and the source impedance $Z_s$. The method of the present invention utilizes a model of the distribution network as illustrated in FIG. 2(a). In this diagram, the tapped loads are lumped together with the rest of the load $Z_{load}$. It is possible to lump all loads together since load impedances $Z_{rload}$ and $Z_{tap}$ from FIG. 1 are much larger than the line impedance.

The methodology of the present invention is derived from equation 5 which is the equation utilized in the reactance method. However, by considering the mutual effect of load flow and fault resistance, the reactance method's susceptibility to error due to load flow and fault resistance is overcome according to the teachings of the present invention.

Figure 2C:
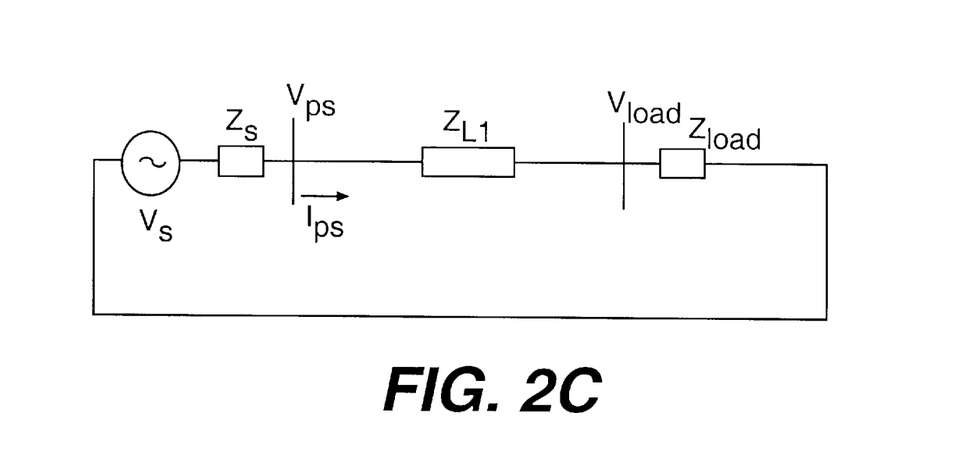
FIG. 2(c) is a schematic diagram illustrating the pre-fault conditions of the system illustrated in FIG. 2(a).
Figure 2D:
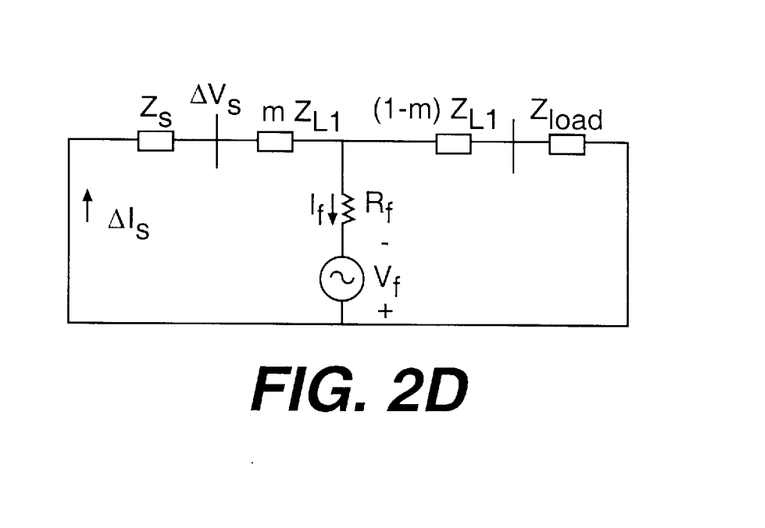
FIG. 2(d) is a schematic diagram of the fault induced changes of the system of FIG. 2(a) superimposed over the pre-fault conditions described in FIG. 2(c) due to the occurrence of a fault.

FIGS. 2(c) and 2(d) are collectively a decomposition of the single line diagram of FIG. 2(a). FIG. 2(c) illustrates the pre-fault conditions which are present before a fault occurs. FIG. 2(d) illustrates a superimposed system which shows only the voltages and currents resultant from the occurrence of a fault, which voltages and currents superimposed on the pre-fault system of FIG. 2(c).

In FIG. 2(c), $V_{ps}$ is the pre-fault voltage supplied by the source, $I_{ps}$ is the pre-fault current supplied by the source, $V_{ps}$ is the post-fault voltage supplied by the source and $I_{ps}$ is the post-vault current supplied by the source, and $V_{load}$ is the voltage seen across the load before the fault. In FIG. 2(d), $\Delta I_s$ is the fault induced change in the source current and is equal to $I_{sf}-I_{ps}$. $\Delta V_s$ is the fault induced change in the source current and is equal to $V_{sf}-V_{ps}$. FIGS. 2 (c) and (d) will be useful in understanding the methodology and system of the present invention.

The methods of the present invention determine fault location and fault resistance solely based on pre-known values and values measured at the sub-station. The method and system of the present also makes use of measured pre-fault knowledge of the source and load impedances, $Z_s$ and $Z_{load}$. Pre-fault and fault voltages and currents measured at the sub-station can be used to calculate those impedances since system impedance is equal to complex voltage divided by complex current.

From FIG. 2(c), the load impedance $Z_{load}$ lumps the tapped loads and the loads beyond the fault location into a single impedance. As previously mentioned, this is possible since the load impedances $Z_{rload}$ and $Z_{tap}$ are much larger than the line impedance. The impedance $Z_{load}$ is calculated as:

$$Z_{load} = \frac{V_{ps}}{I_{ps}} - Z_{L1} \tag{7}$$

where $V_{ps}$ and $I_{ps}$ are measured at the sub-station in a manner described hereinbelow. The impedance $Z_{load}$ incorporates all tapped loads between the sub-station and the fault and the loads beyond the fault. Thus, the method of the present invention allows for compensation for the loads in the system. While equation 7 is for the single-phase representation of the network, the techniques of the present invention are equally applicable for multi-phase systems and the load impedance $Z_{load}$ may then be calculated by using pre-fault positive sequence values as:

$$Z_{load} = Z_{load1} = \frac{V_{ps1}}{I_{ps1}} - Z_{L1} \tag{8}$$

where $V_{ps1}$ and $I_{ps1}$ are pre-fault positive sequence voltage and current. The fault locator is typically provided in the sub-station and is the point at which, $V_{sf}, I_{sf}, V_{ps}$ and $I_{ps}$ are measured. The source impedance behind the fault locator is calculated by using the pre-fault and fault voltage and current measured at the sub-station. Thus, the impedance behind the fault locator $Z_s$ is:

$$Z_s = -\frac{\Delta V_s}{\Delta I_s} \tag{9}$$

where $\Delta V_s = V_{sf} - V_{ps}$, and $\Delta I_s = I_{sf} - I_{ps}$. Superimposed positive sequence voltage and current values should be used in equation 9 for all faults. Alternatively, values from the negative sequence network may be used for unbalanced faults in order to reduce problems with sensitivity for a case where there is only a small difference between pre-fault and fault values in the positive sequence.

The system of the present invention then estimates fault location by making use of the values $Z_{load}$ and $Z_s$ in one of two preferred embodiments. These two methods both make use of the principles of the reactance method (equation 5), but take into consideration the pre-fault equivalent circuit of FIG. 2(c) and the superimposed system equivalent circuit of FIG. 2(d). Because the pre-fault load current is equivalent to the pre-fault source current, $\Delta I_s = I_{sf} - I_{load}$. From FIG. 2(d), the fault caused change in source current is $\Delta I_s = d_s \times I_f$, where $d_s$ is the current distribution factor. The distribution factor describes the change in source current resultant from the fault current $I_f$ and the post-fault load current and thus takes into account load current within the distribution network.

From Equation 4 and the equivalent circuit of FIG. 2(a), $Z_{meas}$ is calculated as:

$$Z_{meas} = \left(\frac{V_{sf}}{I_{sf}}\right) = mZ_{L1} + R_f\left(\frac{I_f}{I_{sf}}\right) \tag{10}$$

Since:

$$d_S = \frac{\Delta I_s}{I_f} \tag{11}$$

and $n_s$ is described as:

$$n_s = \frac{I_{sf}}{I_s} = |n_s| < \gamma_s \tag{12}$$

Therefore, substituting $d_s$ and $n_s$ into the impedance derived from the equivalent circuit of FIG. 2(a) of equation 10, we obtain:

$$Z_{meas} = \frac{V_{sf}}{I_{sf}} = mZ_{L1} + R_f\left(\frac{I_f}{I_{sf}}\right) = mZ_{L1} + R_f * \frac{1}{d_s} * \frac{1}{n_s} \tag{13}$$

The system and method of the present invention solves equation 13 for m in order to determine fault location in one of two manners as will be described below. Note that, from equation 13, it is apparent that the system and method of the present invention consider the effect of fault resistance $R_f$ on fault location m.

The Apparatus Used in the Preferred Embodiments

Figure 3:
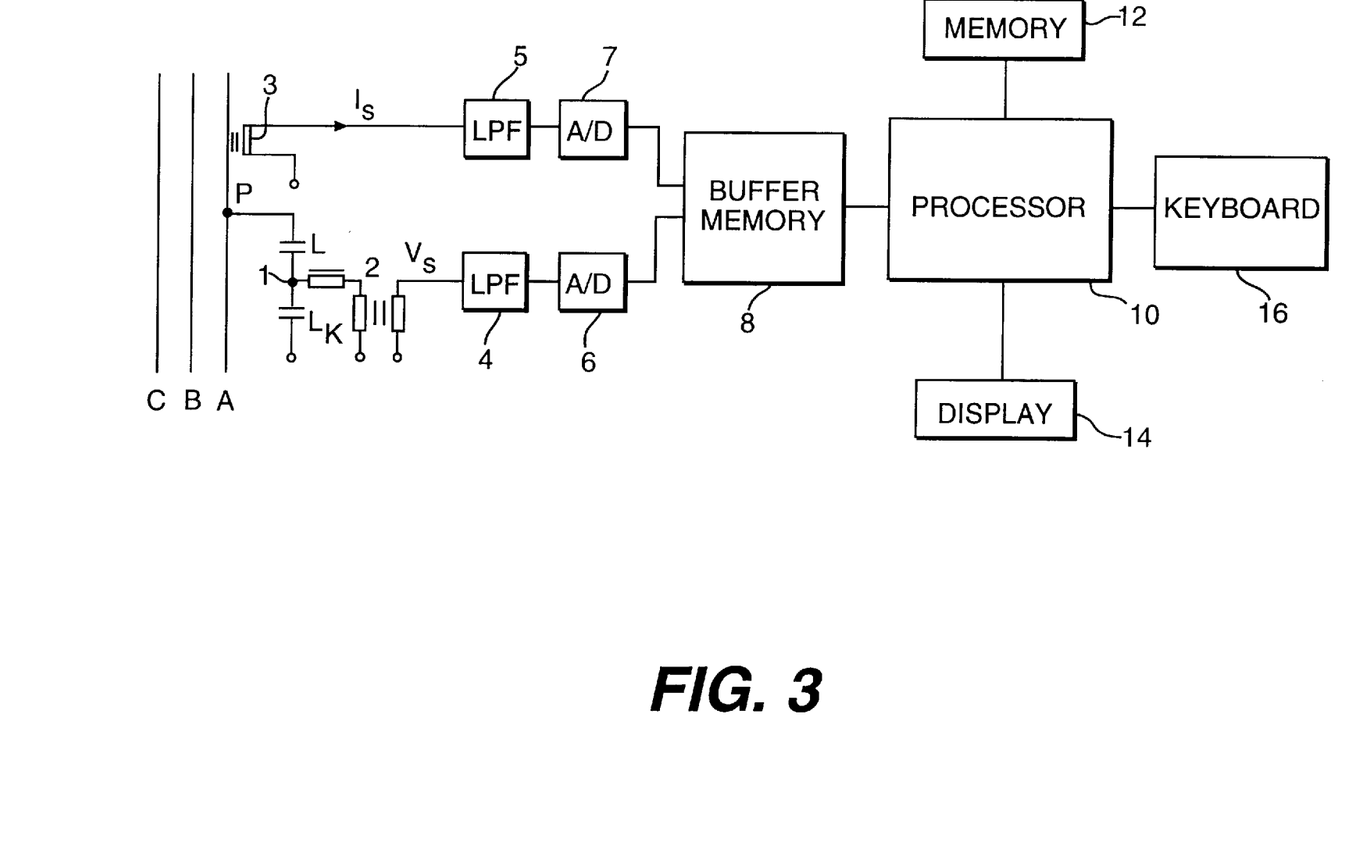
FIG. 3 is a flow chart of the implementation of either the iterative method of FIG. 4 or the direct calculation method of the present application.

The voltage and current parameters utilized by the methodology of the present application may be measured by any known technique. In one preferred embodiment of the invention, the current of each individual phase of the distribution system at the source $I_s$ is measured by a current transformer 3, low pass filtered by low pass filter 5 and A-D converted by A-D converter 7 where the monitored values are stored in a buffer memory 8 for later use in the iterative algorithm described with respect to FIG. 4 of the present specification or in a direct calculation algorithm described with respect to FIG. 5 of the present specification. Both pre-fault current $I_{ps}$ and post-fault current $I_{sf}$ are monitored in this fashion.

Similarly, a capacitive voltage divider 1 monitors the voltage of each line of the distribution system which voltage is isolated by transformer 2 to produce the measurement $V_s$ which is low pass filtered by low pass filter 4, A-D converted by a second A-D converter 6 and also stored in the buffer memory 8. In addition to source or relay located voltages and currents, the processor 10 is also provided with the positive sequence impedance of the distribution network $Z_{L1}$ which is empirically measured prior to the occurrence of a fault. The value of the positive sequence network impedance $Z_{L1}$ may be introduced into the system of the present application any desired fashion, for example through keyboard 16.

The information stored in the buffer memory 8 as well as that introduced via keyboard 16 are processed by the processor 10 in cooperation with a program stored in memory 12 and the results are displayed in display 14. Processor 10 may be of any known type and operates under the program disclosed in greater detail with reference with either FIG. 4 describing the Iterative Method of the present invention or FIG. 5 for the Direct Calculation Method of the present invention.

While the present invention contemplates the storage of the voltage $V_s$ and current $I_s$ values measured thereby, both before and after occurrence of a fault, these values may also be stored, in an alternative embodiment, as phasors to reduce storage requirements.

While the methods employed by the teachings of the present invention are principly described in detail for single phase distribution systems, the concept of the present invention are equally applicable for multi phase distribution systems such as the three phases R, S, and T of FIG. 3. In such a case, the voltage $I_s$ and the current $V_s$ would be measured for each of the phases A–C. The manner of implementing the techniques of the present invention to such 3 phase systems will be described in greater detail hereinbelow.

The Iterative Method of the Present Application

According to the iterative method utilized according to the teachings of the present invention, the fault location m is iteratively determined by estimating and iteratively determining the base phase $\beta_s$ where $\beta_s$ is the phase angle of the phasor $d_s$. The current distribution factor may be derived as:

$$d_s = \frac{\Delta I_s}{I_f} = \frac{Z_{load} + (1-m)Z_{L1}}{Z_s + Z_{load} + Z_{L1}} = |d_s| < \beta_s \tag{14}$$

In this equation $\Delta I_s$ is replaced by:

$$\Delta I_s = |\Delta I_s| \angle \lambda_s \tag{15}$$

Here, $\lambda_s$ is the relative phase angle between $I_{sf}$ and $I_{ps}$. Substituting equation 12 and 14 into equation 13 and calculating for the voltage measured by the locator at the sub-station, we obtain:

$$V_{sf} = mZ_{L1}I_{sf} + R_f\frac{|\Delta I_s|}{|d_s|} < (\lambda_s - \beta_s) \tag{16}$$

$$= mZ_{L1}I_{sf} + D \times \Phi$$

where:

$$D = R_f\frac{|\Delta I_s|}{|d_s|} \tag{17}$$

and where the unit complex number $\Phi$ is related to the angles of the distribution factor $d_s$ and the current change $\Delta I_s$ as:

$$\Phi = 1^{j\phi}, \quad \phi = (\lambda_s - \beta_s) \tag{18}$$

If one assumes that $\beta_s$ is equal to zero, we could consequently approximate that $\Phi = \Phi_{app} = \exp(j \times \lambda_s)$. The angle of the superimposed current, $\lambda_s$ may be measured by the relay and thus $\lambda_s = \angle \Delta I_s = \angle \Phi_{app}$. From this, the complex equation 16 can be separated into real and imaginary parts forming two equations with two unknowns D and m. Eliminating D, through the use of linear equation solving methods, the per unit distance m from the sub-station to the fault location can be calculated as:

$$m = \frac{Re(V_{sf}) \times Im(\Phi) - Im(V_{sf}) \times Re(\Phi)}{R_{L1} \times M - X_{L1} \times N} \quad (19)$$

$$M = [Re(I_{sf}) \times Im(\Phi) - Im(I_{sf}) \times Re(\Phi)]$$

$$N = [Re(I_{sf}) \times Re(\Phi) - Im(I_{sf}) \times Im(\Phi)]$$

where:

$X_{L1}$ is the imaginary component and $R_{L1}$ is the real component of $Z_{L1}$.

In equation 19, the complex number $\Delta I_s$ is actually used instead of $\Phi$ because the magnitude of $\Phi$ has no impact on fault location estimation.

After equation 19 is calculated, equation 14 is used to calculate an upgraded value of the $\angle \beta_s$. Since we know the value of $Z_{L1}$ and have calculated the values of $Z_s$ and $Z_{load}$ using equations 7 and 9 respectively, $\angle \beta_s$ may be easily calculated from equation 14. Thus, a refined estimate of $\angle \beta_s$ may be used to refine the first estimate of the fault location m.

This refinement is accomplished by iteratively repeating equations 14, 18, and 19 to iteratively calculate fault location, using fault location m to improve the estimate of $\beta_s$ and using the improved estimate of $\beta_s$ to improve the estimate of fault location m. As previously mentioned, $Z_{load}$ and $Z_s$ have been calculated from equations 7 and 9 respectively. Then, the distribution factor angle $\beta_s$ is calculated from equation 14 from the last estimate of m, $m_{old}$, $Z_{load}$ and $Z_s$ and $Z_{L1}$. A new value for $\Phi$ can be calculated from equation 18 and thus a new value of m is computed using equation 19. The process then continues to successive iterations until a satisfactory accuracy is reached. This is accomplished in accordance with the flow chart of FIG. 4 as will be described herein below.

Once the fault location m is calculated, this value is used to calculate fault resistance $R_f$ using an equation derived from equation 16 as:

$$R_f = \frac{Re(V_{sf}) - m \times Re(I_{sf} \times Z_{L1})}{Re\left(\frac{\Delta I_s}{d_s}\right)} \quad (20)$$

Note that the values of $\Delta I_s$ and $d_s$ have already been calculated in the process of estimating fault location so that fault resistance may accurately be determined.

Implementation of the Iterative Embodiment

The iterative process of locating faults and estimating fault resistance in accordance with the present invention is implemented by the processor 10 under control of a program stored in the memory 12 which is used to control the processor 10 to implement the iterative method of the present invention as will be described in greater detail with respect to FIG. 4 of the present application.

Figure 4:
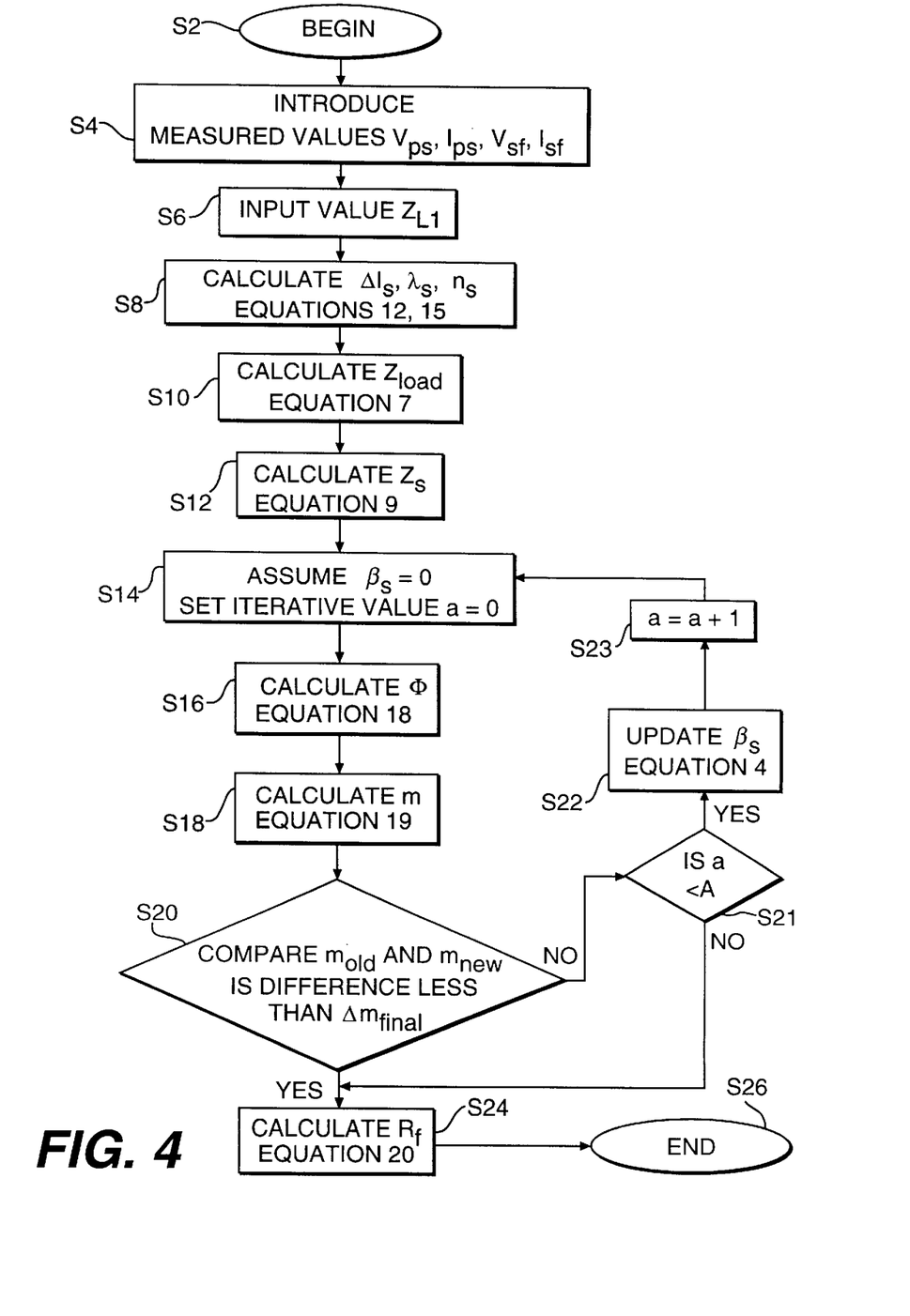
FIG. 4 is a flow chart illustrating the iterative method of the present application, which flow chart is implemented by the processor 10 of FIG. 3.

FIG. 4 is a flow chart illustrating the iterative method of determining fault location m and fault resistance $R_f$ of the present invention. The method of FIG. 4 begins at step S2 and at step S4, the measured pre-fault and post-fault voltages and currents $V_{ps}$, $I_{ps}$, $V_{sf}$, and $I_{sf}$ are introduced to facilitate calculation therewith. As previously explained, these values may be accumulated in the buffer memory 8 in any desired manner, either as raw data which may be converted into complex numerical values under control of the processor 10, or as phasors which may be used more directly. The buffer memory 8 may be physically part of memory 12 as would occur to one of ordinary skill in the art. However, the system of the present invention desirably accumulates voltage and current values as both pre-fault and post-fault voltage and current values should be utilized in accordance with the teachings of the present application.

At step S6, the distribution network line impedance values $Z_{L1}$ is introduced. This value is empirically calculated prior to a fault condition as is well known in the art.

At step S8, $\Delta I_s$ s is calculated from $I_{sf}$ and $I_{ps}$, $\lambda_s$ is determined from $\Delta I_s$ using Equation 15 and $n_s$ is calculated utilizing Equation 12. At Equation S10, $Z_{load}$ is calculated using Equation 7, while at step S12, $Z_s$ is calculated by the processor 10 utilizing Equation 9. At step S14, $\beta_s$ is assumed to be zero. In the embodiment of FIG. 4, $\beta_s$ is the phase angle of the distribution factor $d_s$ which, as is apparent from equation 14, is related to fault location m. By iterating steps S16, S18, S20, and S22, the error in both $\beta_s$ and m can be made to converge. Thus, at step S16, $\Phi$ which is related to the phase angle of $\beta_s$ and $\lambda_s$ of the distribution factor $d_s$ and the current change $\Delta I_s$, respectively, is calculated according to equation 18.

At step S18, a value for the per unit distance from the sub-station to the fault location m is calculated according to Equation 19. However, since $\Phi$ is a value directly affected by the base phase $\beta_s$ an error will exist in initial calculations of the value m calculated using equations 19 in step S18. At step S20, the previous calculated value of m, $m_{old}$ is compared to the most recently calculated value of m, $m_{new}$ to determine the change in m, thereby determining the degree of convergence in m. If S18 has only performed the calculation of m a single time, $m_{old}$ is assumed to be zero and thus a first iteration is assured. Assuming the difference between $m_{old}$ and $m_{new}$ is greater than a predetermined threshold, then $\beta_s$ is updated using Equation 14 and steps S16 and S18 are again performed. Note that the threshold $\Delta m$ should be set to the value of acceptable error in the per unit distance m from the sub-station to the fault location. For example, m might be set at 0.0001 and steps S16, S18, S20, and S22 would be performed until the difference between $m_{old}$ and $m_{new}$ is less than this threshold.

It is the intent of the algorithm of FIG. 4 to allow the fault location m to converge to within the pre-determined limit $\Delta m$. However, desirably in accordance with the teachings of the present application, the number of iterations of steps S16, S18, S20, and S22 should be limited to ensure the calculation is concluded. Accordingly, Step S14 also sets an iteration value a to zero. At step S21, the iteration value a is compared to a maximum iteration number A. If a is less than A, the iteration value a is incremented and iteration is performed. However, if the iteration value a reaches the iteration limit A, m is determined to be $m_{new}$ and iteration is completed.

At step S24, Equation 20 is utilized to calculate the fault resistance $R_f$.

From the forgoing, it is apparent that the iterative method of the present invention may accurately calculate both fault location as a percentage of distribution network line length as well as fault resistance.

The Direct Calculation Method of The Present Application

Another method directly solves for fault location m. This method combines equations 14 and 16 to calculate fault location. First, a quadratic equation in m is derived. By separating this complex equation into real and imaginary equations and eliminating fault resistance $R_f$, a per unit distance to the fault m is calculated. Equation 14 for the current distribution factor is:

$$d_s = \frac{\Delta I_s}{I_f} = \frac{Z_{load} + (1-m)Z_{L1}}{Z_s + Z_{load} + Z_{L1}} \quad (14)$$

where:

$$\Delta I_s = I_{sf} - I_{ps} \quad (21)$$

Equation 16 can be written as:

$$V_{sf} = mZ_{L1}I_{sf} + R_f \frac{\Delta I_s}{d_s} \quad (16)$$

Substituting Equation 14 into Equation 16 and rearranging obtains:

$$m^2 - mk_1 + k_2 - k_3 R_f = 0 \quad (22)$$

where:

$$k_1 = \frac{V_{sf}}{I_{sf}Z_{L1}} + \frac{Z_{load}}{z_{L1}} + 1 \quad (23)$$

$$k_2 = \frac{V_{sf}}{I_{sf}Z_{L1}} \left( \frac{Z_{load}}{Z_{L1}} + 1 \right) \quad (24)$$

$$k_3 = \frac{\Delta I_s}{I_{sf}Z_{L1}} \left( \frac{Z_s + Z_{load}}{Z_{L1}} + 1 \right) \quad (25)$$

The impedances $Z_s$ AND $Z_{load}$ are calculated by using Equations 9 and 7 respectively. Complex Equation 22 has two unknowns, m and $R_f$. This equation can be separated into real and imaginary parts. By eliminating $R_f$, m is given by:

$$m = \frac{-b \pm \sqrt{b^2 - 4ac}}{2a} \quad (26)$$

where:

$$a = 1$$

$$b = -\left( Re(k_1) - \frac{Im(k_1) \times Re(k_3)}{Im(k_3)} \right) \quad (27)$$

$$c = Re(k_2) - \frac{Im(k_2) \times Re(k_3)}{Im(k_3)}$$

The inventors have ascertained that the proper solution for m is given by:

$$m = \frac{-b - \sqrt{b^2 - 4ac}}{2a} \quad (28)$$

Once an accurate value for m is obtained, the fault resistance $R_f$ may be accurately obtained by solving for the imaginary part of equation (22) as follows:

$$R_f = -m \times \frac{Im(k_1)}{Im(k_3)} + \frac{Im(k_2)}{Im(k_3)} \quad (29)$$

Implementation of the Direct Calculation Embodiment

While the iterative method is capable of accurately calculating both fault location and fault resistance, a direct method may be alternatively used. The direct method avoids the iterative approach of the iterative method but involves significantly more complex calculations. Thus, the direct method forms an alternative method in accordance with the present invention. In the direct method, the hardware of FIG. 3 is utilized. However, this hardware is utilized under control of a different program which will be described hereinbelow with reference to FIG. 5 of the present application.

The program utilized in the direct calculation method of the present application will now be described with reference to FIG. 5 of the present application. The program of FIG. 5 begins at step S30. At step S32, the measured pre-fault and post-fault voltages and currents are introduced to facilitate calculation therewith. As previously explained, these values may be accumulated in the buffer memory 8 in any desired manor, either as raw data which may be converted into complex numerical values under control of the processor 10, or as phasors which may be used more directly. At step S34, the distribution network line impedance value $Z_{L1}$ is introduced. This value is empirically calculated prior to occurrence of a fault condition as is well known in the art. As is also the case with the iterative embodiment of FIG. 4, S36, $Z_{load}$ is calculated utilizing Equation 7, while at step S38, $Z_s$ is calculated by the processor utilizing Equation 9. At step S40 equation values $k_1$–$k_3$ are calculated utilizing Equations 23–25. At step S42 values b and c utilized in Equation 26 are calculated using Equations 27. At step S44, m is then calculated utilizing Equation 28. Thus, the distance to the fault is determined by direct calculation. Equation 29 is then utilized in step S46 to calculate fault resistance $R_f$ to complete the operation of the direct calculation algorithm according to the teachings of the present application.

Calculation of Fault Location and Resistance for 3-Phase Power Networks

Either of the iterative method or direct calculation method of the present invention may be utilized to determine fault location and fault resistance values in a multi-phase power network. While the above discussion of the iterative and direct calculation embodiments contemplates a single-phase representation of the network, a similar methodology can be implemented for any fault type in a multi-phase network such a commonly used three phase network. The equations described above for the measurement of fault location and fault resistance may be utilized to calculate fault location and resistance of 3-phase faults in distribution networks and their feeders when the measured quantities $V_{sf}$, $I_{sf}$ and $\Delta I_s$ are properly selected. The selection of these values depends on fault type.

Table 2 of the present application defines these values for various types of faults. In order to implement the techniques of the present application, the fault type in Table 2 must be selected. The fault type is selected through an evaluation of the change in current in each of the legs of the multi-phase system. For example, in a 3-phase system, $\Delta I_A$, $\Delta I_B$, and $\Delta I_C$, are first determined. The relative values of the calculated change in current on each of the legs are then utilized to identify fault type.

It is well known that any 3-phase system may be described by 3 balanced systems of phasors, the so called positive-sequence components, negative-sequence components and zero-sequence components. As described in the instant specification, the use of the additional subscript 1 describes positive sequence components, the use of the subscript 2 describes negative sequence components, and the use of the subscript 0 describes zero-sequence components. For example, $V_{Asf1}$ denotes the positive sequence source voltage of phase A after a fault has occurred. Each phase of the 3-phase system may be described as the sum of the positive, negative and zero-sequence components.

In order to determine fault type, the current through each of the phases of the multi-phase network is monitored both before and after the occurrence of the fault. The change in current induced by the fault, the resultant fault current, is calculated by removing the post-fault zero-sequence current from the post-fault current phasor of each phase, and then subtracting the measured pre-fault load current as follows:

$$\Delta I_A = (I_{Asf} - I_{Osf}) - I_{Aps} = \Delta I_{A1} + \Delta I_{A2} \quad (30)$$
$$\Delta I_B = (I_{Bsf} - I_{Osf}) - I_{Bps} = \Delta I_{B1} + \Delta I_{B2}$$
$$\Delta I_C = (I_{Csf} - I_{Osf}) - I_{Cps} = \Delta I_{C1} + \Delta I_{C2}$$

where:

$3I_{osf} = I_{Asf} + I_{Bsf} + I_{Csf}$, $I_{Aps}$, $I_{Bps}$, $I_{Cps}$ are the measured pre-fault current phasors for phases A–C;

$I_{Asf}$, $I_{Bsf}$, and $I_{Csf}$ are the measured post-fault current phasors for phases A–C $I_{A0}$, $I_{B0}$, and $I_{C0}$ are the zero sequence current phasors, $I_{A1}$, $I_{B1}$, and $I_{C1}$ are the positive sequence current phasors and $I_{A2}$, $I_{B2}$, and $I_{C2}$ are the negative sequence current phasors.

The resulting fault current is the sum of the positive sequence current and negative sequence current changes induced by the fault. Once the change in current on each phase of the distribution system are then compared with each other to identify fault type in accordance with the parameters set forth herein in Table 1.

|  | Fault Type | | | | | | | | |
|---|---|---|---|---|---|---|---|---|---|
|  | A G | B G | C G | A B | B C | C A | AB G | BC G | CA G |
| $\|\Delta I_A\| > 1.5 \times \|\Delta I_B\|$ | X |  |  | X |  |  |  |  | X |
| $\|\Delta I_A\| > 1.5 \times \|\Delta I_C\|$ | X |  |  |  | X |  |  | X |  |
| $\|\Delta I_B\| > 1.5 \times \|\Delta I_A\|$ |  | X |  |  | X |  |  | X |  |
| $\|\Delta I_B\| > 1.5 \times \|\Delta I_C\|$ |  | X |  | X |  |  | X |  |  |
| $\|\Delta I_C\| > 1.5 \times \|\Delta I_A\|$ |  |  | X | X |  |  | X |  |  |
| $\|\Delta I_C\| > 1.5 \times \|\Delta I_B\|$ |  |  | X |  | X |  |  |  | X |

For example, if $|\Delta I_A| > 1.5 \times |\Delta I_C|$ and if $|\Delta I_B| > 1.5 \times |\Delta I_C|$ then the fault must be a phase A to phase B fault or phase-a to phase-b to ground fault. It is not necessary to determine which of these faults is correct in order to calculate fault location and resistance as fault voltage $V_{sf1}$, fault current $I_{sf}$ and superimposed current $\Delta I_s$ are the same for each of these faults as illustrated in Table 2.

It is possible that the criteria described in Table 1 will not result in the identification of one of these specific fault types. In such a case, the fault identified is a 3-phase fault and thus the fault is determined to be one of the a-b-c or a-b-c-g fault types at the bottom of Table 2. Note that both of these fault types employ the same measurement for $V_{sf}$, $I_{sf}$, and $\Delta I_s$.

Once the fault type is determined, $I_{sf}$ and $V_{sf}$ are determined from Table 2. While not specifically indicated in Table 2, $V_{ps}$ and $I_{ps}$ are calculated in a similar manner. For example, in phase A to ground faults A–G, $V_{ps} = V_{psa}$ while $I_{ps} = I_{psa} + k \times I_{ps0}$.

In the pre-fault system, $V_{psA}$, $V_{psB}$, and $V_{psC}$ will be relatively balanced. Similarly, $I_{psA}$, $I_{psB}$, and $I_{psC}$ should also be relatively balanced. In such cases, while the voltages and currents pre-fault for phase-a would preferably be selected, it would also be possible to utilize another phase for monitoring pre-fault voltage and current. However, this change in the system of the present invention would produce a less accurate result.

Figure 5:
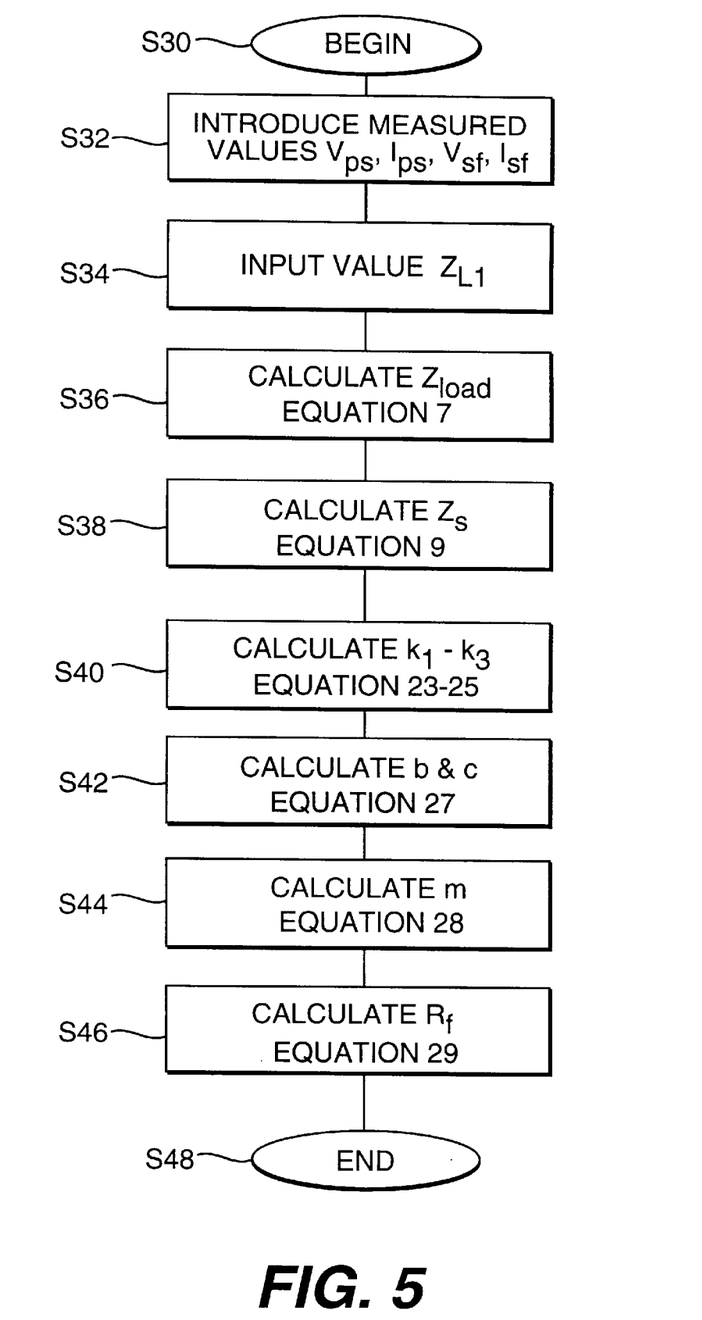
FIG. 5 is a flow chart of the direct calculation method of the present application which flow chart is implemented by the processor 10 of FIG. 3.

Once $V_{ps}$, $I_{ps}$, $V_{sf}$ and $I_{sf}$ are determined from Table 2 m and $R_f$ may be calculated using either the algorithms of FIG. 4 or FIG. 5 to determine fault location and resistance in accordance with the teachings of the present application.

Figure 6:
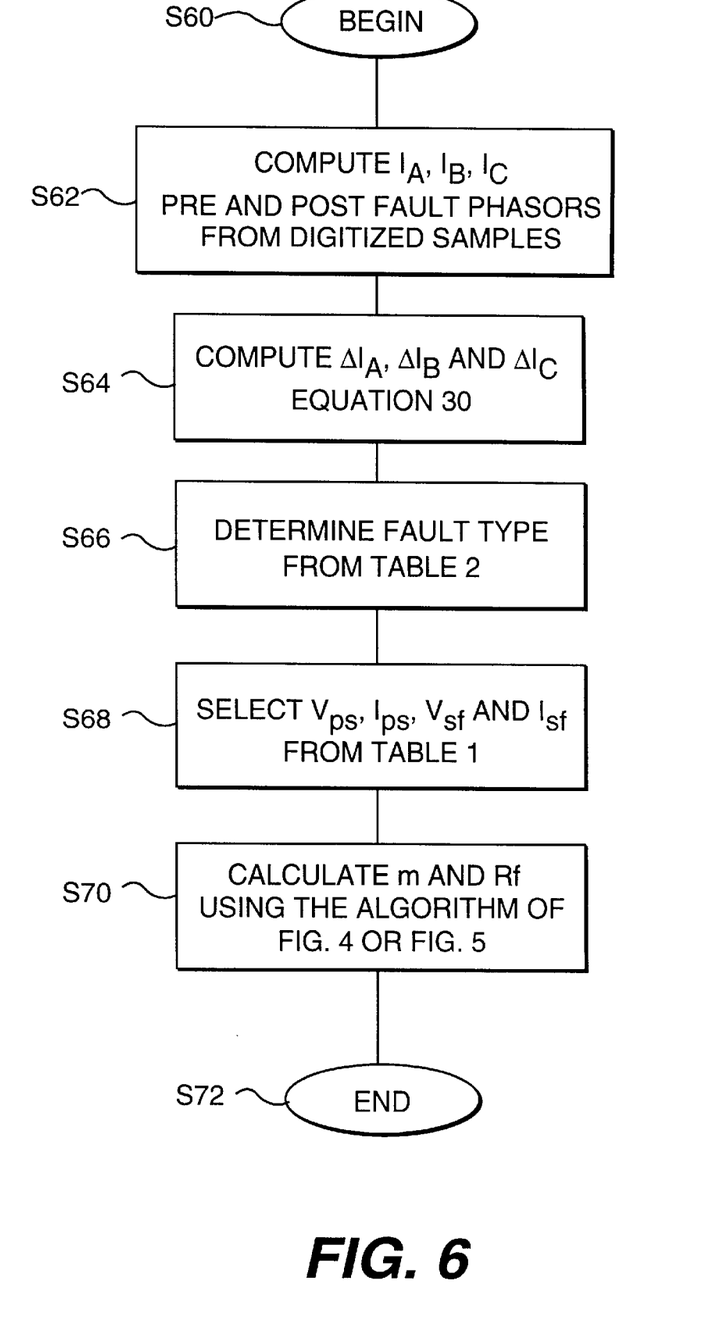
FIG. 6 is a flow chart of the implementation of either the iterative method of FIG. 4 or the direct method of FIG. 5.

The above mentioned description is illustrated in further detail in the algorithm of FIG. 6 of the instant application. In FIG. 6, the algorithm begins at step S60 and, at step S62, $I_A$, $I_B$, $I_C$, $V_A$, $V_B$, and $V_C$ are computed both pre and post-fault from digitized samples obtained by the system of the present application. In step S64, $\Delta I_A$, $\Delta I_B$, and $\Delta I_C$ are calculated utilizing equation 30. In step S66, fault type is determined from Table 1 as described herein above. At step S68, the fault type is utilized to select $V_{sf}$, $I_{sf}$, as well as $V_{ps}$, $I_{ps}$ from Table 2 as described herein above.

At step S70, the FIG. 6 algorithm then employs the body of either the FIG. 4 algorithm or the FIG. 5 algorithm. For example, in the FIG. 4 algorithm, even steps S6–S24 as well as steps S21, S23 are performed to produce an iteratively calculated value of m and $R_f$ is calculated. In the same manor described above with respect to the single phase embodiment of the invention. Similarly, if the direct calculation methodology is implemented, even steps S34–S46 are implemented using the values developed in step S68. The program then ends at step S72, with a calculation of fault location and fault resistance for the multi-phase network.

TABLE 2

Voltages and currents for different fault types

| Fault Type | Fault Voltage $V_{sf}$ | Fault Current $I_{sf}$ | Superimposed Current $\Delta I_s$ |
|---|---|---|---|
| a-g | $V_{sfa}$ | $I_{sfa} + kxI$ | $3X\Delta I_{s1a}$ |
| b-g | $V_{sfb}$ | $I_{sfb} + kxI$ | $3x\Delta I_{s1b}$ |
| c-g | $V_{sfc}$ | $I_{sfc} + kxI$ | $3x\Delta I_{s1c}$ |
| b-c | $V_{sfb} - V_{sfc}$ | $I_{sfb} - I_{sf}$ | $\Delta I_{sb} - \Delta I_{sc}$ |
| a-b | $V_{sfa} - V_{sfb}$ | $I_{sfa} - I_{sf}$ | $\Delta I_{sa} - \Delta I_{sb}$ |
| c-a | $V_{sfc} - V_{sfa}$ | $I_{sfc} - I_{sf}$ | $\Delta I_{sc} - \Delta I_{sa}$ |
| b-c-g | $V_{sfb} - V_{sfc}$ | $I_{sfb} - I_{sf}$ | $\Delta I_{sb} - \Delta I_{sc}$ |
| a-b-g | $V_{sfa} - V_{sfb}$ | $I_{sfa} - I_{sf}$ | $\Delta I_{sa} - \Delta I_{sb}$ |
| c-a-g | $V_{sfc} - V_{sfa}$ | $I_{sfc} - I_{sf}$ | $\Delta I_{sc} - \Delta I_{sa}$ |
| a-b-c | $V_{sfb} - V_{sfc}$ | $I_{sfb} - I_{sf}$ | $\Delta I_{sb} - \Delta I_{sc}$ |
| a-b-c-g | $V_{sfb} - V_{sfc}$ | $I_{sfb} - I_{sf}$ | $\Delta I_{sb} - \Delta I_{sc}$ | where measured data at the substation S is defined as:

| | |
|---|---|
| $V_{sfa}$ | measured phase "a" fault voltage at the substation S |
| $V_{sfb}$ | measuted phase "b" fault voltage at the substation S |
| $V_{sfc}$ | measured phase "c" fault voltage at the substation S |
| $I_{sfa}$ | measured phase "a" fault current at the substation S |
| $I_{sfb}$ | measured phase "b" fault current at the substation S |
| $I_{sfc}$ | measured phase "c" fault current at the substation S |
| $V_{psa}$ | measured phase "a" pre-fault voltage at the substation S |
| $V_{psb}$ | measured phase "b" pre-fault voltage at the substation S |
| $V_{psc}$ | meaauted phase "c" pre-fault voltage at the substation S |
| $I_{psa}$ | measured phase "a" pre-fault load current at the subatation S |
| $I_{psb}$ | measured phase "b" pre-fault load current at the substation S |
| $I_{psc}$ | measured phase "c" pre-fault load current at the substation S |

Calculated data $\Delta I_{sa} = I_{sfa} - I_{psa}$ superimposed current in phase "a"

$\Delta I_{sb} = I_{sfb} - I_{psb}$ superimposed current in phase "b"

$\Delta I_{sc} = I_{sfc} - I_{psc}$ superimposed current in phase "c"

$\Delta I_{s1a} = I_{sf1a} - I_{ps1a}$ superimposed positive sequence current related to phase "a"

$\Delta I_{s1b} = I_{sf1b} - I_{ps1b}$ superimposed positive sequence current related to phase "b"

$\Delta I_{s1c} = I_{sf1c} - I_{ps1c}$ superimposed positive sequence current related to phase "c"

$I_{ps1a}$ positive sequence pre-fault load current related to phase "a"

$I_{ps1b}$ positive sequence pre-fault load current related to phase "b"

$I_{ps1c}$ positive sequence pre-fault load current related to phase "c"

where:

| | |
|---|---|
| $I_{s0}$ | zero sequence fault current |
| $I_{sf1a}$ | positive sequence fault current related to phase "a" |
| $I_{sf1b}$ | positive sequence fault current related to phase "b" |
| $I_{sf1c}$ | positive sequence fault current related to phase "c" | where:

$$I_{sf0} = \frac{1}{3} \times (I_{sfa} + I_{sfb} + I_{sfc})$$

$$I_{sf1a} = \frac{1}{3} \times (I_{sfa} + e^{j120^0} \times I_{sfb} + e^{j240^0} \times I_{sfc})$$

$$I_{sf1b} = \frac{1}{3} \times (I_{sfb} + e^{j120^0} \times I_{sfc} + e^{j240^0} \times I_{sfa})$$

$$I_{sf1c} = \frac{1}{3} \times (I_{sfc} + e^{j120^0} \times I_{sfa} + e^{j240^0} \times I_{sfb})$$

To perform the method of the present application in three phase systems, $R_{L1}$ and $X_{L1}$ are obtained as follows.
Line parameters
$Z_{L1}$ positive sequence line impedance (ohms/mile)
$Z_{L0}$ zero sequence line impedance (ohms/mile)
L line length (miles)
The values calculated from the line parameters in methods
$Z_{L1} = Z_{L1} * L$ positive sequence line impedance (ohms)
$Z_{L0} = Z_{L0} * L$ zero sequence line impedance (ohms)
$R_{L1} = Re(Z_{L1})$ positive sequence line resistance
$X_{L1} = Im(Z_{L1})$ positive sequence line reactance $$k = \frac{Z_{L0} - Z_{L1}}{Z_{L1}}$$

the fault current for single phase to ground fault.

In addition to the selection of fault type and the use of the above mentioned values or $V_{sf}$, $I_{sf}$ and $\Delta I_s$ in a multi-phase embodiment, the source impedance $Z_s$ should be calculated by using superimposed positive sequence voltage and current related to any of the three phases. This value is symmetrical and does not depend on fault type. Accordingly, if positive sequence in phase "a" is used, it follows:

$$Z_S = -\frac{\Delta \times V_{s1a}}{\Delta I_{S1a}}$$

where:
$\Delta V_{s1a} = V_{sf1a} - V_{ps1a}$ superimposed positive sequence current related to phase "a"
$V_{ps1a}$ is the positive sequence pre-fault load voltage related to phase "a"
$V_{ps1a} = \frac{1}{3} \times (V_{psa} + e^{j120°} \times V_{psb} + e^{j240°} \times V_{psc})$
$V_{sf1a}$ is the positive sequence fault voltage related to phase "a"
$V_{sf1a} = \frac{1}{3} \times (V_{sfa} + e^{j120°} \times V_{sfb} + W^{j240°} \times V_{sfc})$ It is apparent from the above presented Table 2 and the accompanying definitions and related equations that one of ordinary skill in the art can easily utilize the iterative or direct calculation technique of the present invention in a multi-phase power distribution network once fault type is established as outlined above. Fault type is easily established on the basis of a comparison of pre and post-fault current values in the memory described with respect to Table 2. For example, a sudden drop in a single line of the 3-phase distribution line signals a single line to ground-fault such as a-g, b-g, and c-g.

From the foregoing description of the operation of the system of the present invention, it is apparent that the system of the present application allows for improved fault location and detection of fault resistance in distribution networks. Such improved fault location is important to speed-up restoration of power supply to the customers, reduce the number of switching operations to isolate faults and to help in fault analysis. It should be understood, however, that the preferred embodiments described above are exemplary and the teachings of the present application are applicable to other embodiments as would occur to one of ordinary skill in the art. Accordingly, the scope of the present application is not limited by the specification as described soles by the appended claims.

We claim:

1. A method for locating faults and estimating fault resistance in a distribution network with a feeder having tapped loads, the method comprising:
    a) obtaining known circuit parameters including measuring pre and post fault current and voltage values at a monitoring location on said feeder;
    b) calculating the load and source impedance $Z_{load}$ and $Z_s$ from the known circuit parameters measured in said step a);
    c) identifying equations which consider the effect of fault resistance and fault induced change in load current and which relates fault location to known circuit parameters without generation of an estimate of fault resistance and without use of a reactance algorithm;
    d) solving the equations of step c) to develop a fault location value.

2. The method of claim 1 wherein said step a) of obtaining includes determining the per unit impedance of the distribution network $Z_{L1}$.

3. The method of claim 1 wherein said step b) calculates load and source impedance $Z_{load}$ and $Z_s$ from the pre and post fault current and voltage values measured at the monitoring location.

4. The method of claim 1 wherein said equations include a quadratic equation with the fault location m as the quadratic variable,
    said step d) solving the quadratic equation derived in said step b) to develop a fault location value m.

5. The method of claim 4 wherein said quadratic equation is $$m^2 - mk_1 + k_2 - k_3 R_f = 0$$

where $$k_1 = \frac{v_{sf}}{I_{sf} Z_{L1}} + \frac{Z_{load}}{z_{L1}} + 1$$

$$k_2 = \frac{v_{sf}}{I_{sf} Z_{L1}} \left( \frac{Z_{load}}{Z_{L1}} + 1 \right)$$

$$k_3 = \frac{\Delta I_s}{I_{sf} Z_{L1}} \left( \frac{Z_s + Z_{load}}{Z_{L1}} + 1 \right)$$

and where:
    m is the fault location as a proportion of distribution network size,
    $R_f$ is the fault impedance,
    $V_{sf}$ is the post fault voltage,
    $I_{sf}$ is the post fault current,
    $I_{ps}$ is the pre fault current,
    $Z_{L1}$ is the per unit line impedance of the distribution network, $Z_s$ is the source impedance, $Z_{load}$ is the load impedance, and $\Delta I_s = I_{sf} - I_{ps}$.

6. The method of claim 5 wherein said step b) of calculating the load impedance $Z_{load}$ is calculated by:

$$Z_{load} = \frac{V_{ps}}{I_{ps}} - Z_{L1}$$

and, of calculating the source impedance $Z_s$ is calculated by:

$$Z_s = -\frac{\Delta V_s}{\Delta I_s}.$$

7. The method of claim 1 further comprising the step e) of determining fault resistance based on fault location.

8. The method of claim 7 further comprising the step e) of determining fault resistance based on fault location by the equation:

$$R_f = -m \times \frac{Im(k_1)}{Im(k_3)} + \frac{Im(k_2)}{Im(k_3)}$$

9. The method of claim 1 wherein the location of a fault is represented by m, said step c) of identifying equations includes the substeps of, i) identifying an equation for calculating θ, a unit complex number related to a phase angle $\beta_s$ of a distribution factor, ii) identifying an equation for calculating fault location m based on the value of θ to be calculated in the equation identified in said substep i), and iii) deriving an equation for calculating the phase angle $\beta_s$ of the current distribution factor $d_s$ based on the value of m to be obtained from the equation identified in said substep ii) while considering a variable related to fault resistance.

10. The method of claim 9 wherein said step d) of solving includes the substeps of, i) estimating the phase angle $\beta_s$ of the current distribution factor $d_s$, ii) using the equation identified in said substep c)i) to calculating an estimate of θ based on $\beta_s$, iii) using the equation identified in said step c)ii) for calculating an estimate of fault location m based on the value of θ calculated in said substep d)ii), iv) using the equation identified in said step c)iii) for calculating a new value of the phase angle $\beta_s$ of the current distribution factor $d_s$ based on the value of m obtained in said step d) while considering a variable related to fault resistance, and v) repeating said substeps ii)–iv) until m converges to a desired accuracy.

11. A method of locating faults and estimating fault resistance in a distribution network having tapped loads arranged off a feeder, the method comprising:

a) calculating the load and source impedance $Z_{load}$ and $Z_s$ from pre and post fault current and voltage values measured at a monitoring location;

b) estimating the phase angle $\beta_s$ of the current distribution factor $d_s$;

c) calculating an estimate of θ, a unit complex number related to $\beta_s$;

d) calculating an estimate of fault location m based on the value of θ calculated in said step c);

e) calculating a new value of the phase angle $\beta_s$ of the current distribution factor $d_s$ based on the value of m obtained in said step d) while considering a variable related to fault resistance;

f) repeating said steps c)–e) until m converges to a desired accuracy.

12. The method of claim 11 wherein said step a) of calculating calculates the load impedance $Z_{load}$ by $$Z_{load} = \frac{V_{ps}}{I_{ps}} - Z_{L1}$$

where $V_{ps}$ is the pre-fault voltage, $I_{ps}$ is the pre-fault current, and $Z_{L1}$ is the positive sequence line impedance; and calculates the source impedance $Z_s$ by $$Z_s = -\frac{\Delta V_s}{\Delta I_s}$$

where $V_{sf}$ is the post fault voltage, $I_{sf}$ is the post fault current, $\Delta V_s = V_{sf} - V_{ps}$, and $\Delta I_s = I_{sf} - I_{ps}$.

13. The method of claim 11 wherein said step c of calculating an estimate of θ is performed according to:

$$\Phi = 1^{j\phi},\ \phi = (\lambda_s - \beta_s)$$

where $\lambda_s$ is the relative phase angle between $I_{sf}$, the post-fault source current, and $I_{ps}$, the pre-fault source current.

14. The method of claim 13 wherein said step d) of calculating an estimate of fault location m is performed by:

$$m = \frac{Re(V_{sf}) \times Im(\Phi) - Im(V_{sf}) \times Re(\Phi)}{R_{L1} \times M - X_{L1} \times N}$$

$$M = (Re(I_{sf}) \times Im(\Phi) - Im(I_{sf}) \times Re(\Phi))$$

$$N = (Re(I_{sf}) \times Re(\Phi) - Im(I_{sf}) \times Im(\Phi))$$

where:

$V_{sf}$ and $I_{sf}$ are the post fault voltage and current, and $R_{L1}$ and $X_{L1}$ are, respectively, the positive sequence line resistance and reactance measured at the source.

15. The method of claim 14 wherein said step a) of calculating calculates the load impedance $Z_{load}$ by $$Z_{load} = \frac{V_{ps}}{I_{ps}} - Z_{L1}$$

where $V_{ps}$ is the pre-fault voltage, $I_{ps}$ is the pre-fault current, and $Z_{L1}$ is the positive sequence line impedance; and calculates the source impedance $Z_s$ by $$Z_s = -\frac{\Delta V_s}{\Delta I_s}$$

where $V_{sf}$ is the post fault voltage, $I_{sf}$ is the post fault current, $\Delta V_s = V_{sf} - V_{ps}$, and $\Delta I_s = I_{sf} - I_{ps}$.

16. The method of claim 15 wherein said step e) calculates the phase angle $\beta_s$ by:

$$d_s = \frac{\Delta I_s}{I_f} = \frac{Z_{load} + (1-m)Z_{L1}}{Z_s + Z_{load} + Z_{L1}} = |d_s| < \beta_s$$

where $Z_{L1}$ is the positive sequence line impedance of the distribution network.

17. The method of claim 16 wherein $\beta_s$ is estimated in said step b) to be 0.

18. The method of claim 11 further comprising the step of:
g) outputting m as the final fault location value when the number of iterations of steps c)–e) exceeds a predetermined value A.

19. The method of claim 11 further comprising the step of:
g) determining fault resistance based on fault location.

20. The method of claim 19 wherein said step g) of determining determines fault resistance based on fault location by the equation:

$$R_f = \frac{Re(V_{sf}) - m \times Re(I_{sf} \times Z_{L1})}{Re\left(\frac{\Delta I_s}{d_s}\right)}$$

21. The method of claim 11 wherein said distribution network is a three phase distribution network;
wherein said method further comprises the steps of,
  i) obtaining phase specific pre and post-fault currents and voltage for each phase at said monitored location,
  ii) identifying the type of fault which has occurred,
  iii) based on the type of fault identified in substep ii), identifying pre and post-current and voltage values to be used in steps a)–d).

22. A system for locating faults and estimating fault resistance in a distribution network having tapped loads comprising:
a voltage sensor for measuring line voltage at a monitoring or source location;
a current sensor for measuring line current at a monitoring or source location;
said voltage and current sensors developing pre-fault voltage and current measurements $V_{ps}$ and $I_{ps}$, and post-fault voltage and current measurements $V_{sf}$ and $I_{sf}$;
means for calculating the load and source impedance $Z_{load}$ and $Z_s$ from the pre-fault voltage and current measurements $V_{ps}$ and $I_{ps}$, and post-fault voltage and current measurements $V_{sf}$ and $I_{sf}$ as well as the per unit distribution network impedance $Z_{L1}$;
means for solving equations which consider the effect of fault resistance and fault induced change in load current and which relates fault location to known circuit parameters to develop a fault location value m.

23. The system of claim 22 wherein said equations solved by said means for solving include a quadratic equation with the fault location m as the quadratic variable.

24. The system of claim 23 wherein said quadratic equation is $$m^2 - mk_1 + k_2 - k_3 R_f = 0$$

where $$k_1 = \frac{V_{sf}}{I_{sf} Z_{L1}} + \frac{Z_{load}}{Z_{L1}} + 1$$

$$k_2 = \frac{V_{sf}}{I_{sf} Z_{L1}} \left(\frac{Z_{load}}{Z_{L1}} + 1\right)$$

$$k_3 = \frac{\Delta I_s}{I_{sf} Z_{L1}} \left(\frac{Z_s + Z_{load}}{Z_{L1}} + 1\right)$$

and where:
m is the fault location as a proportion of distribution network size,
$R_f$ is the fault impedance,
$V_{sf}$ is the post fault voltage,
$I_{sf}$ is the post fault current,
$I_{ps}$ is the pre-fault current,
$Z_{L1}$ is the per unit line impedance of the distribution network,
$Z_s$ is the source impedance,
$Z_{load}$ is the load impedance, and
$\Delta I_s = I_{sf} - I_{ps}$.

25. The system of claim 22 further comprising means for determining fault resistance based on fault location.

26. The system of claim 22 wherein said means for solving equations includes,
first means for identifying an equation for calculating θ, a unit complex number related to the phase angle $\beta_s$ of the distribution factor,
second means for identifying an equation for calculating fault location m based on the value of θ to be calculated in the equation identified by said first means, and
means for deriving an equation for calculating the phase angle $\beta_s$ of the current distribution factor $d_s$ based on the value of m to be obtained from the equation identified by said second means while considering a variable related to fault resistance.

27. The system of claim 26 wherein said means for solving equations first estimates the phase angle $\beta_s$ to be zero,
first means for calculating θ based on $\beta_s$,
second means for calculating fault location m based on the value of θ, and
third means for calculating the phase angle $\beta_s$ of the current distribution factor $d_s$ based on the value of m while considering a variable related to fault resistance;
said means for solving iteratively processing in said first through third means for calculating based on converging estimates of the values of m and $\beta_s$ until a desired accuracy is reached.

28. A system for locating faults and estimating fault resistance in a distribution network having tapped loads comprising:
a voltage sensor for measuring line voltage at a monitoring or source location;
a current sensor for measuring line current at a monitoring or source location;
said voltage and current sensors developing pre-fault voltage and current measurements $V_{ps}$ and $I_{ps}$, and post-fault voltage and current measurements $V_{sf}$ and $I_{sf}$;
impedance calculation means for calculating the load and source impedance $Z_{load}$ and $Z_s$ from the pre-fault voltage and current measurements $V_{ps}$ and $I_{ps}$, and post-fault voltage and current measurements $V_{sf}$ and $I_{sf}$ as well as the per unit distribution network impedance $Z_{L1}$;

means for iteratively solving equations which consider the effect of fault resistance and fault induced change in load current and which relates fault location to known circuit parameters to develop a fault location value m including,
- first means for calculating θ, a unit complex number, based on an estimate of $\beta_s$, the phase angle of the current distribution factor,
- second means for calculating fault location m based on the value of θ, and
- third means for calculating the phase angle $\beta_s$ of the current distribution factor $d_s$ based on the value of m while considering a variable related to fault resistance;

said means for iteratively solving iteratively processing in said first through third means for calculating based on converging estimates of the values of m and $\beta_s$ until a desired accuracy is reached.

29. The system of claim 28 wherein the value of $\beta_s$ first supplied to said first means is 0.

30. The system of claim 28 further comprising means for determining fault resistance based on fault location.

31. The system of claim 28 wherein said distribution network is a multiphase distribution network, wherein said voltage sensor sensing the voltage on each phase of said multiphase distribution network;

said current sensor sensing the current on each phase of said multi-phase distribution network; said system further comprising:

means for identifying the type of fault and for creating said pre-fault voltage and current measurements $V_{ps}$ and $I_{ps}$ and said post-fault voltage and current measurements $V_{sf}$ and $I_{sf}$ based on the type of fault and said values measured by said voltage and current sensors;

said impedance calculation means including the step of selecting pre-fault voltage and current measurements $V_{ps}$ and $I_{ps}$ and post fault voltage and current measurements $V_{sf}$ and $I_{sf}$ based on the type of fault identified.

* * * * *